(12) United States Patent
Shimada et al.

(10) Patent No.: US 10,461,227 B2
(45) Date of Patent: Oct. 29, 2019

(54) METHOD FOR MANUFACTURING LIGHT EMITTING DEVICE, AND LIGHT EMITTING DEVICE

(71) Applicant: NICHIA CORPORATION, Anan-shi, Tokushima (JP)

(72) Inventors: Yusuke Shimada, Anan (JP); Motoaki Mando, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/491,934

(22) Filed: Apr. 19, 2017

(65) Prior Publication Data

US 2017/0222104 A1    Aug. 3, 2017

Related U.S. Application Data

(62) Division of application No. 14/223,742, filed on Mar. 24, 2014, now Pat. No. 9,660,148.

(30) Foreign Application Priority Data

Mar. 25, 2013 (JP) ................. 2013-062910

(51) Int. Cl.
*H01L 33/54* (2010.01)
*H01L 33/52* (2010.01)
(Continued)

(52) U.S. Cl.
CPC ............ *H01L 33/54* (2013.01); *H01L 33/486* (2013.01); *H01L 33/52* (2013.01); *H01L 33/56* (2013.01);
(Continued)

(58) Field of Classification Search
CPC ................................. H01L 33/48–486
See application file for complete search history.

(56) References Cited

U.S. PATENT DOCUMENTS 6,953,952 B2    10/2005   Asakawa
8,530,250 B2     9/2013   Ichikawa et al.
(Continued)

FOREIGN PATENT DOCUMENTS

JP    2004-186488 A    7/2004
JP    2008-166487 A    7/2008
(Continued)

OTHER PUBLICATIONS

Restriction Requirement issued in U.S. Appl. No. 14/223,742 dated Nov. 16, 2015.
(Continued)

*Primary Examiner* — Stephen W Smoot
*Assistant Examiner* — Sun Mi Kim King
(74) *Attorney, Agent, or Firm* — Foley & Lardner LLP

(57) ABSTRACT

A method for manufacturing a light emitting device comprises a package preparation step of preparing a package having a recess in which a light emitting element is locatable, wherein the package includes a projection extending from an upper surface of the package, the projection at least partially surrounding the recess, a sealing resin forming step of filling said recess in which said light emitting element is located with a sealing resin, and providing said sealing resin higher than the height of said package, and a sealing resin cutting step of cutting the sealing resin such that an upper surface of the sealing resin is at a height that is substantially the same as a height of the upper surface of the package.

19 Claims, 7 Drawing Sheets

(51) Int. Cl.
*H01L 33/48* (2010.01)
*H01L 33/56* (2010.01)

(52) U.S. Cl.
CPC ........... *H01L 2224/48091* (2013.01); *H01L 2224/48247* (2013.01); *H01L 2224/48465* (2013.01); *H01L 2933/005* (2013.01); *H01L 2933/0033* (2013.01)

(56) References Cited

U.S. PATENT DOCUMENTS

| | | | |
|---|---|---|---|
| 2010/0065879 A1 | 3/2010 | Kirsch et al. | |
| 2010/0110659 A1 | 5/2010 | Nakajima | |
| 2011/0108866 A1* | 5/2011 | Lee | H01L 33/486 257/98 |
| 2012/0146077 A1 | 6/2012 | Nakatsu et al. | |
| 2013/0032842 A1 | 2/2013 | Park et al. | |
| 2013/0105973 A1 | 5/2013 | Gan et al. | |
| 2013/0121000 A1* | 5/2013 | Lee | H01L 33/486 362/293 |
| 2013/0270594 A1* | 10/2013 | Cai | H01L 33/48 257/98 |
| 2014/0124812 A1 | 5/2014 | Kuramoto et al. | |

FOREIGN PATENT DOCUMENTS

| | | |
|---|---|---|
| JP | 2010-062272 A | 3/2010 |
| JP | 2010-109170 A | 5/2010 |
| JP | 2010-519775 A | 6/2010 |
| JP | 2010-182746 A | 8/2010 |
| JP | 2010-206039 A | 9/2010 |
| WO | WO-2011/021402 | 2/2011 |

OTHER PUBLICATIONS

Non-Final Office Action issued in U.S. Appl. No. 14/223,742 dated Mar. 25, 2016.
Final Office Action issued in U.S. Appl. No. 14/223,742 dated Oct. 3, 2016.
Notice of Allowance issued in U.S. Appl. No. 14/223,742 dated Jan. 25, 2017.

* cited by examiner

METHOD FOR MANUFACTURING LIGHT EMITTING DEVICE, AND LIGHT EMITTING DEVICE

CROSS-REFERENCE TO RELATED APPLICATIONS

This application is a divisional of U.S. patent application Ser. No. 14/223,742, filed on Mar. 24, 2014, which claims priority to Japanese Patent Application No. 2013-062910, filed on Mar. 25, 2013, the disclosures of which are hereby incorporated by reference in their entireties.

BACKGROUND

The present disclosure relates to a method for manufacturing light emitting devices, and light emitting devices.

Generally speaking, a light emitting device using a light emitting element is known to be compact, energy efficient, and emits light of a vivid color. Since the light emitting elements related to the light emitting devices are semiconductor elements, they not only have the characteristics of reduced concern for burned out bulbs, but also excellent initial driving characteristics as well as high vibration and repetitive on-off switching resistance. Because of such superior characteristics, light emitting devices using light emitting elements, such as light emitting diodes (LED) and laser diodes (LD), are utilized as various types of light sources.

As an example of such a light emitting device, one having a recess in the package has been disclosed where a light emitting element is mounted on the bottom surface of the recess, and the recess is filled with a sealing resin (see JP 2010-109170, JP 2004-186488, and JP 2010-062272).

Such light emitting devices are typically put together in a container, such as a bag, after being produced.

Conventional light emitting devices have smooth upper surfaces, i.e., the upper surfaces forming the outer frames of the recesses (see FIG. 2A). Because of their smooth upper surfaces, light emitting devices easily adhere to one another, creating the problem of readily sticking to one another when handled in groups. If they easily stick to one another, it can be difficult to maintain the light emitting devices in an individually independent state. This makes the handling of the devices difficult. During a light emission inspection, for example, multiple light emitting devices being adhered to one another may clog the path of the measuring equipment or make the measurement at the measuring position impossible.

SUMMARY OF THE INVENTION

According to one embodiment of the present invention, the method for manufacturing light emitting devices includes a package preparation step for preparing a package having a recess for placing a light emitting element, a sealing resin forming step for filling the recess where the light emitting element has been placed with a sealing resin and forming the sealing resin higher than the package height, and a sealing resin cutting step for adjusting by cutting the sealing resin to bring it closer to the height of the package, wherein said package has a projection formed on a surrounding surface area of the recess.

According to another embodiment of the present invention, the light emitting device is equipped with a light emitting element, a package having a recess for placing the light emitting element, and a sealing resin which fills the recess, wherein a projection is provided on the surrounding surface of the recess, and the projection has a rough surface section on the upper surface.

BRIEF DESCRIPTION OF THE DRAWINGS

A more complete appreciation of embodiments of the invention and many of the attendant advantages thereof will be readily obtained by reference to the following detailed descriptions when considered in connection with the accompanying drawings.

DESCRIPTION OF THE EMBODIMENTS

Figure 1:
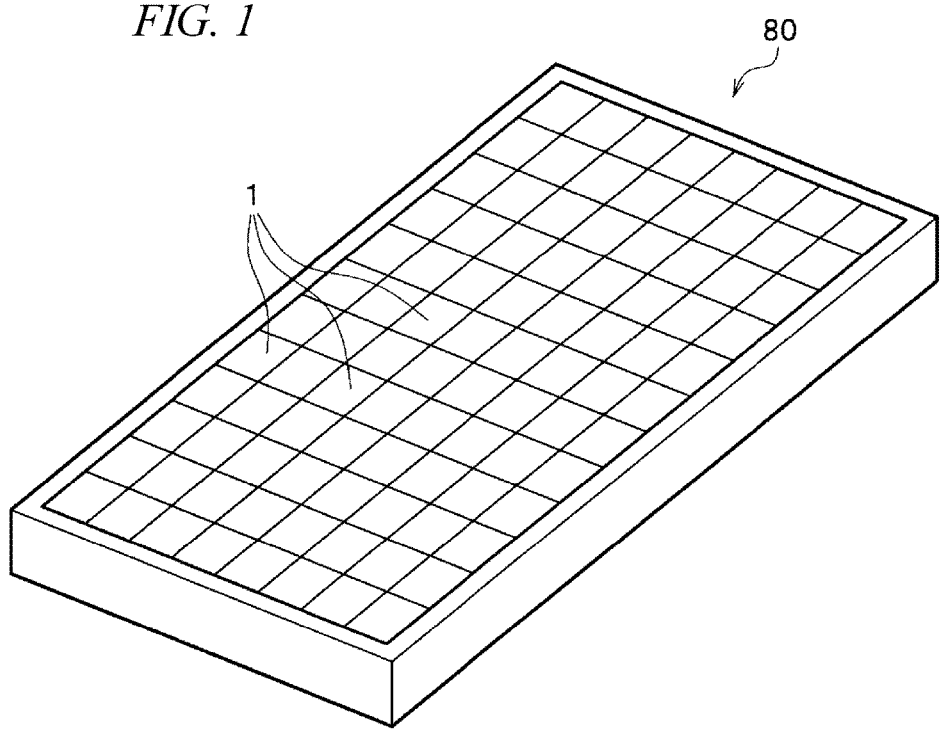
FIG. 1 is a schematic view showing one example of an array before obtaining the light emitting devices.

Embodiments of a method for manufacturing light emitting devices and light emitting devices will be explained below with reference to the drawings. The sizes and positional relationships of the components shown in each drawing may be exaggerated to make the explanation clear. In the following explanation, moreover, those having the same designations and reference numerals are the same, or of materials of similar quality as a rule, for which detailed explanations are omitted as deemed appropriate.

Light Emitting Device

First, the light emitting device in the embodiments will be explained.

First Embodiment

Figure 2A:
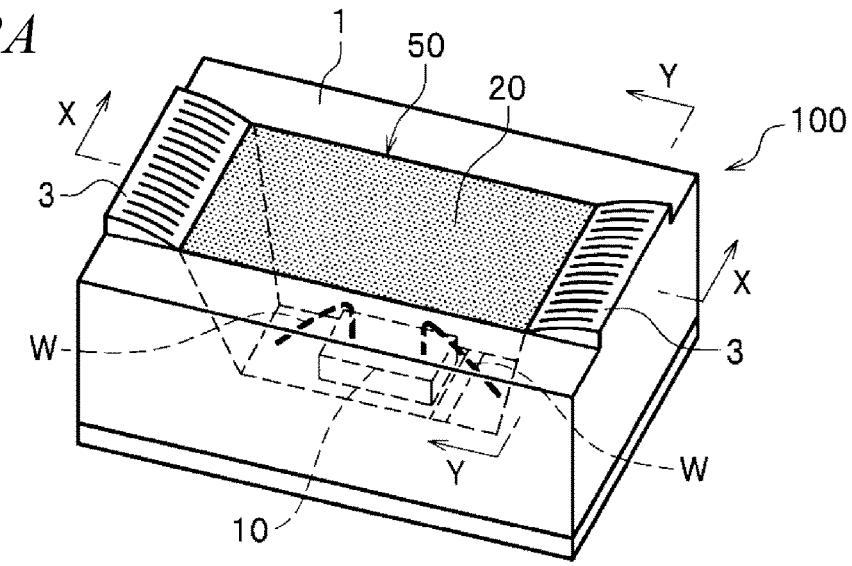
FIG. 2A is a perspective view of an example of a light emitting device according to a first embodiment.
Figure 2B:
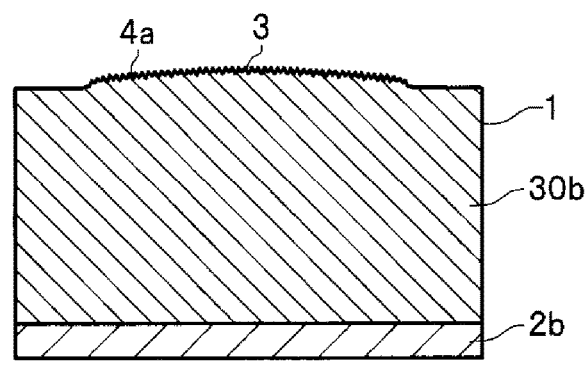
FIG. 2B is a cross section of the light emitting device shown in FIG. 2A taken along Y-Y.
Figure 2C:
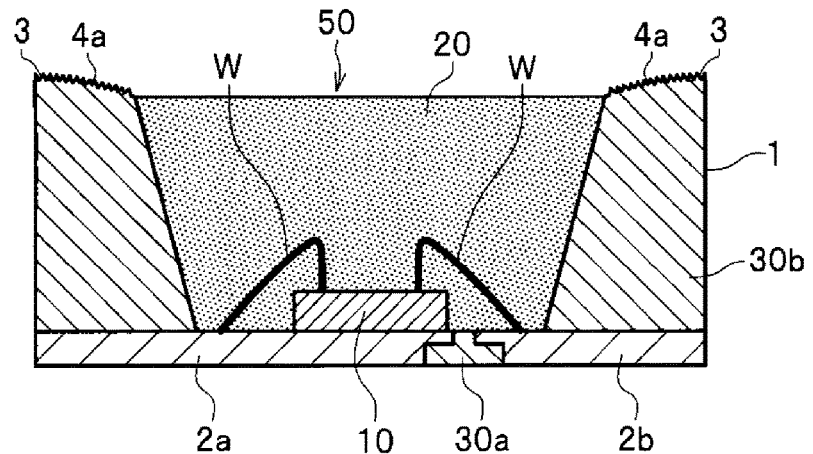
FIG. 2C is a cross section of the light emitting device shown in FIG. 2A taken along X-X.

As shown in FIGS. 2A to 2C, the light emitting device 100 comprises a package 1 which has a recess 50, conductive materials 2a and 2b provided at the bottom of the package 1 so as to be exposed to the bottom surface of the recess 50, light emitting element 10 disposed on the conductive material 2a, and a sealing resin 20 filling the recess 50 of the package 1. Furthermore, the light emitting device 100 has projections 3 on the surrounding surface areas of the recess 50, and rough surface sections 4a on the upper surfaces of the projections 3.

The light emitting device 100 may be individually produced, or by singulating an array 80 where plural packages 1 are contiguously prepared as shown in FIG. 1. In order to show the constitution of the embodiment in an easy-to-understand manner, the sealing resin 20 is shown in a transparent state in FIGS. 2A to 2C.

Each constituent element will be explained below.

Package

The package 1 contains and protects an electronic component, such as a light emitting element 10, or the like.

As shown in FIG. 2C, the package 1 comprises a base material 30a and conductive materials 2a and 2b, which form the bottom surface, and side material 30b which forms the side surfaces. The base material 30a, conductive materials 2a and 2b, and side material 30b form the recess 50 with an opening at the upper surface. In this construction, the side material 30b is provided on the conductive materials 2a and 2b.

For the materials used for package 1, an insulating material is preferable, and a material which does not readily allow transmission of the light emitted by the light emitting element 10, external light, or the like, is preferable. Moreover, a material having a certain degree of strength is preferable. Specific examples include ceramics ($Al_2O_3$, AlN, or the like), and resins, such as phenol resin, epoxy resin, polyimide resin, BT resin (bismaleimide triazine resin), polyphthalamide (PPA), or the like. Particularly, using a highly light resistant epoxy resin or silicone resin is preferable.

In cases where a resin is used for package 1, mixing inorganic fillers, such as glass fibers, $SiO_2$, $TiO_2$, $Al_2O_3$ or the like, with the resin can promote an increase in the mechanical strength, a reduction in the thermal expansion, an increase in the reflection coefficient, or the like.

Conductive Material

The conductive materials 2a and 2b electrically connect an electronic component such as a light emitting element 10 with the outside, and supply current (power) to the electronic component from the outside. In other words, they play a role of an external electrode, or a part thereof, for applying current from the outside.

Moreover, the conductive materials 2a and 2b are respectively positive and negative electrodes, and these electrodes are disposed apart from one another at the bottom surface of the package 1. In other words, the conductive materials 2a and 2b are disposed separately, horizontally (laterally) at the bottom surface of the package 1, the conductive material 2a being the positive electrode (anode) and conductive material 2b being the negative electrode (cathode). The light emitting element 10 is mounted on the conductive material 2a.

The materials for the conductive materials 2a and 2b can be suitably selected depending on the material used as the package 1 and the method for manufacturing the light emitting device 100. For example, in cases where ceramics are used as the material for the package 1, a material having a high melting point capable of withstanding the firing temperature for the ceramics sheet is preferable, and for example, using metals having a high melting point, such as tungsten, molybdenum, or the like, is preferable.

In cases where a glass fiber reinforced epoxy resin, or the like, is used as the material for the package 1, a material that can be easily processed is preferable for the conductive materials 2a and 2b. In cases where an injection molded epoxy resin is used as the material for the package 1, a material that can be easily processed by punching, etching, bending, or the like, and has a relatively high mechanical strength, is preferable for the conductive materials 2a and 2b. Specific examples include metals, such as copper, aluminum, gold, silver, tungsten, iron, nickel, or the like, or iron-nickel alloy, phosphor bronze, copper-iron alloy, molybdenum, or the like.

The conductive materials 2a and 2b also function as heat dissipation paths. In order to increase the heat dissipation, it is preferable to provide them in a large area, and for example, providing them in a large width in the widthwise direction of the package (the direction in which the projections 3 are provided in FIG. 2A, for example) is preferable.

A resist for protecting the conductive materials 2a and 2b may also be provided on the surfaces of the base material 30a and/or conductive materials 2a and 2b. It is preferable for the resist to be a reflective film to increase the reflection coefficient. For such a material, a white insulating material, such as a titanium oxide containing silicone resin, or the like, can be used.

As shown in FIGS. 2A to 2C, the light emitting device 100 has projections 3 on the surrounding surface areas of the recess 50. In other words, it has the projections 3 on the upper surface areas of the side material 30b which form the outer frame of the recess 50.

Here, the package 1 is formed to have a ratio of a different length and width in a plan view of the surrounding surface of the recess 50, and the projections 3 are provided on the shorter surrounding surface areas of the package 1. In other words, the package 1 has a lengthwise direction (long surrounding surface areas) and a widthwise direction (short surrounding surface areas), and the projections 3 are disposed in the widthwise direction of the package 1. The projections 3 may be provided in both lengthwise and widthwise directions, or only in the lengthwise direction, but it is preferable to provide them in the widthwise direction of the package 1, as shown in FIG. 2A. By providing the projections 3 in the widthwise direction of the package 1, the effect of the projections 3 discussed later can be further enhanced.

The shape of the projection 3 is not particularly limited. Here, the projections 3 are given a gradual increase in height in the lengthwise direction from the inside of the light emitting package 100 (recess 50) towards the outside, giving a slope to the projections 3 from the inside (recess 50) towards the outer side of the light emitting device 100. This, as described later, is because the projections are formed on the surrounding surface areas of the recesses 50 of the array 80 (see FIG. 5B) by utilizing an elastic release sheet, and then the packages are singulated by cutting along the broken lines shown in FIG. 5B. The shape of the projection 3 before forming the rough surface section 4a, therefore, corresponds to the shape of one half of the region that is cut along the broken line shown in FIG. 5B.

The projection 3 has a rough surface section 4a on the upper surface.

The upper surface of the projection 3 is the surface located on the upper side of the projection 3 among all surfaces of the projection 3 which is cut by an edged tool, for example, when the rough surface section 4a is formed in the method of manufacturing light emitting devices discussed later. This surface, however, is not strictly defined. In the first embodiment, the rough surface section 4a is not formed on the side surfaces of the projection 3 (the sections parallel to the side surfaces of the package 1).

The rough surface section 4a is a rough surface region having a prescribed surface roughness Ra resulting from a section of the projection 3 being cut when cutting the sealing resin 20.

Providing rough surface sections 4a further prevents the light emitting devices 100 from adhering to one another. The extent of the rough surface section 4a on the upper surface of the projection 3 is not particularly limited; any extent will suffice as long as the effect of the embodiment is produced.

The height of the projection 3 (the maximum height) is preferably 3 to 7 μm. Setting the height of projection 3 to 3 μm or higher further improves the effect of preventing the light emitting devices 100 from adhering to one another. From the perspective of making the formation of the rough surface section 4a easier, it is preferable to set the height of the projection 3 to 7 μm at most. The height of the projection 3 here refers to the maximum height in the state where the rough surface section 4a is formed.

The surface characteristics (surface roughness Ra, for example) and the cut amount of the projection 3 are controlled by suitably adjusting the cutting speed, the pressure and angle of the edged tool, or the like, when cutting one section of the projection 3 in the later discussed sealing resin cutting step.

The methods of forming the projection 3 and rough surface section 4a will be explained in the later described method for manufacturing light emitting devices.

Figure 4C:
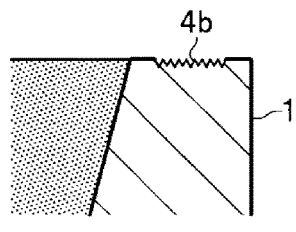
FIG. 4C is a front cross section of a light emitting device in which a package includes rough surface sections with no projection.
Figure 4F:
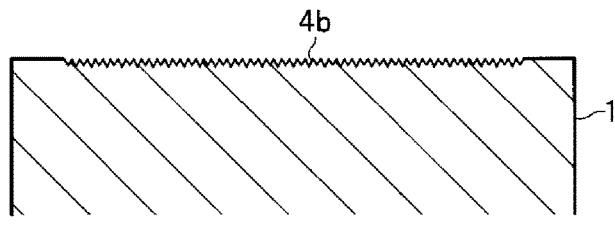
FIG. 4F is a side cross section of the light emitting device shown in FIG. 4C.
Figure 5A:
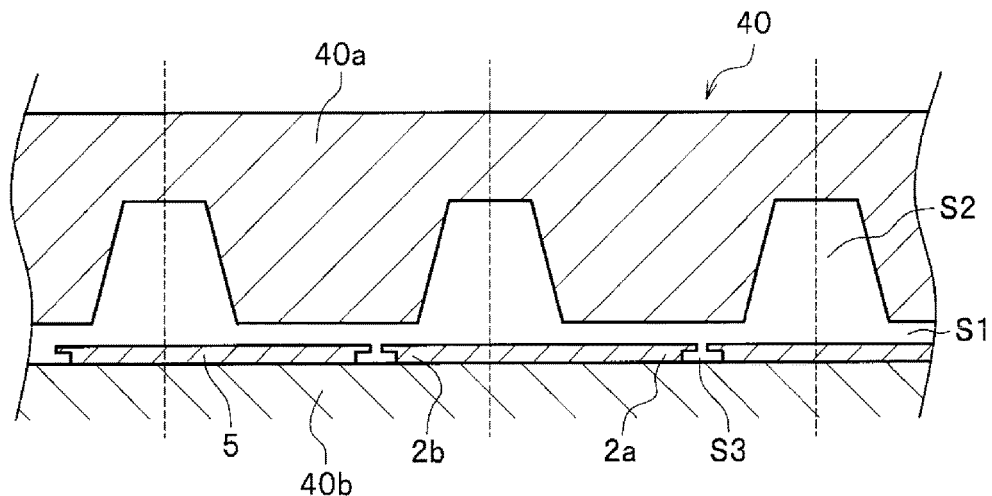
FIG. 5A is a schematic view showing an upper mold and a sheet-shaped lead frames placed on a lower mold, during a package preparation step.
Figures 5B, 5C:
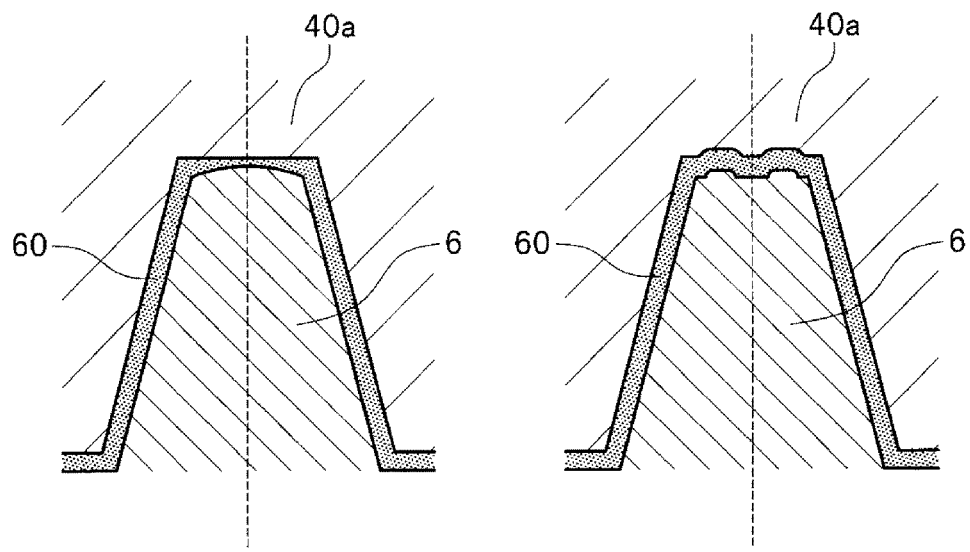
FIG. 5B is a schematic view showing an epoxy resin injected in a mold, with a release sheet interposed between the upper mold and the resin, during a package preparation step.
FIG. 5C is a schematic view showing an epoxy resin injected in a mold, with a release sheet interposed between the upper mold and the resin, and with an upper mold that is shaped to form projections, during a package preparation step.

Here, the shape of the projection 3 of the light emitting device 100 was explained by using a form having a rough surface section 4a, but the shape may be one without a rough surface section 4a (see FIG. 5B). Alternatively, a rough surface 4b may be formed in the region where the projection 3 had been formed by cutting the projection off entirely (see FIGS. 4C and 4F related to the second embodiment).

Light Emitting Element

The light emitting element 10 is a face-up element having electrodes on the upper surface (light emitting surface) which is connected to the conductive material 2a and mounted on the package 1. One wire W connected to the upper surface of the light emitting element 10 is connected to the conductive material 2a, and the other wire W is connected to the conductive material 2b to electrically connect the light emitting element 10 and the conductive materials 2a and 2b. The light emitting surface is the opposite side of the surface that faces the conductive materials 2a and 2b when mounted on the package 1, i.e., the light extraction surface of the light emitting device.

For the light emitting element 10, it is preferable to use a light emitting diode having a semiconductor layer including an n layer, a p layer, and a light emitting region, and any desired wavelength can be selected. As a blue (light having a wavelength of 430 nm-490 nm) or green (light having a wavelength of 490 nm-570 nm) light emitting element 10, for example, ZnSe, nitride based semiconductor ($In_XAl_YGa_{1-X-Y}N$, $0 \leq X$, $0 \leq Y$, $X+Y \leq 1$), GaP, or the like, can be used. As a red (light having a wavelength of 620 nm-750 nm) light emitting element 10, GaAlAs, AlInGaP, or the like, can be used. In cases where a fluorescent material is used in the light emitting device 100, a nitride semiconductor ($In_XAl_YGa_{1-X-Y}N$, $0 \leq X$, $0 \leq Y$, $X+Y \leq 1$) capable of short wavelength emissions and efficient excitation of the fluorescent material can be suitably used. By adjusting the active layer materials or a mixed crystal thereof, various emission wavelengths can be selected. Moreover, a light emitting element 10 made of materials other than the above may alternatively be used. The composition, luminescent color, size, quantities, or the like, of the light emitting element 10 can be suitably selected in accordance with the purpose.

It is preferable to use a translucent substrate, such as sapphire, for the light emitting element 10.

Besides light in the visible light range, the light emitting element 10 can be created to output ultraviolet or infrared radiation.

Sealing Resin

The sealing resin 20 is provided for the purpose of protecting the light emitting element 10 mounted on the package 1 from dust, moisture, external force, or the like, and improving the optical characteristics of the light emitting element 10, such as the light extraction efficiency, wavelength conversion, or the like.

As shown in FIGS. 2A and 2C, the sealing resin 20 fills the recess 50 of the package 1, and the light emitting element 10 is covered by the sealing resin 20. Here, the sealing resin 20 is disposed so that the light emitting element 10 is entirely buried therein.

It is preferable to dispose the sealing resin 20 to the same height as that of the package 1. In other words, it is preferable if the upper surface of the sealing resin 20 is flush with the upper surface of the package 1.

Here, "the upper surface of the sealing resin 20" refers to the upper surface of the sealing resin 20 on the side from which the light from the light emitting element 10 is extracted, i.e., the uppermost surface that is exposed above the recess 50. "The upper surface of the package 1" refers to the upper surface of the outer frame that forms the recess 50, i.e., the upper surface of the side material 30b.

Since this construction can form the upper surface of the sealing resin 20 flat without any sinks, the efficiency of light extraction from the light emitting element 10 is improved. Moreover, since the sealing resin 20 does not project from the upper surface of the package 1, the tackiness of the sealing resin 20 does not affect the package, thereby increasing the effect of preventing the packages from adhering to one another.

For the material for the sealing resin 20, a translucent material which allows the light from the light emitting element 10 to pass through is preferable. Specific materials include a silicone resin, epoxy resin, modified types thereof, urea resin, or the like. Since silicone resins are particularly highly tacky, the adhesion prevention effect of the embodiment can be effectively achieved. In addition to these organic materials, inorganic materials such as oxides may alternatively be employed. Moreover, in addition to these materials, a phosphor, coloring agent, light diffusing agent, filler, or the like, may be included as desired for the light extraction efficiency and wavelength conversion. The sealing resin 20 can be formed as a single layer (material) or a multilayer consisting of two or more layers. As for the coating amount (filling amount) of the sealing resin 20, it will suffice if the resin covers the light emitting element 10 mounted on the package 1.

On the surface (upper surface) of the sealing resin 20, plural grooves of about 1 μm in width and depth are formed so as to extend in the moving direction of the edged tool during the sealing resin cutting step. Providing grooves in the sealing resin 20 increases the surface area to improve heat dissipation.

The grooves are formed on the surface of the sealing resin 20 by cutting the sealing resin 20 in the sealing resin cutting step.

According to the light emitting device 100 in this embodiment discussed above, when the light emitting device 100 is operated, among the light advancing in all directions from the light emitting element 10, the light moving in the upward direction is extracted from the top of the light emitting device 100. The light advancing in the downward or lateral direction is reflected or scattered by the surfaces of the base material 30*a* and the side material 30*b*, conductive materials 2*a* and 2*b*, or resist, to be extracted from the top of the light emitting device 100. Moreover, the light emitting devices 100 are prevented from adhering to one another.

Second Embodiment

Figure 3A:
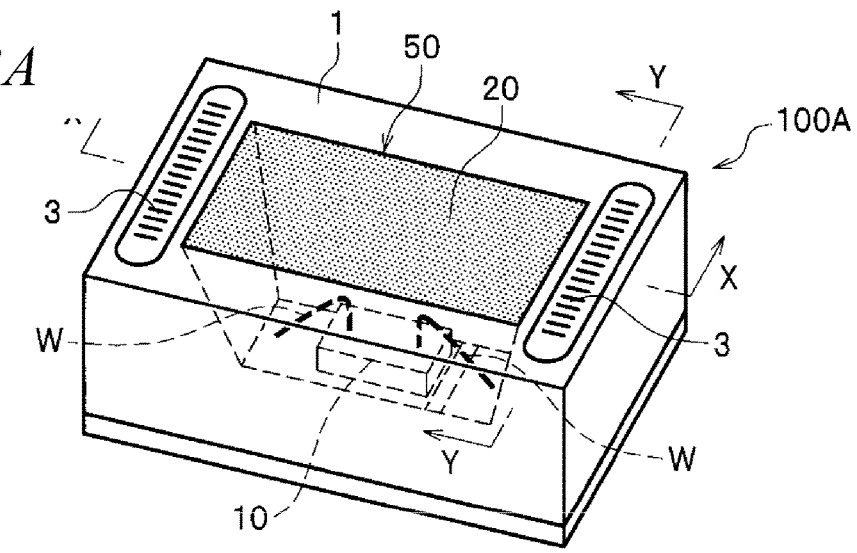
FIG. 3A is a perspective view of an example of a light emitting device according to a second embodiment.
Figure 3B:
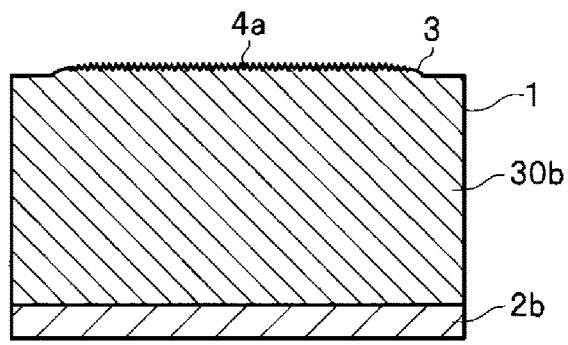
FIG. 3B is a cross section of the light emitting device shown in FIG. 3A taken along Y-Y.
Figure 3C:
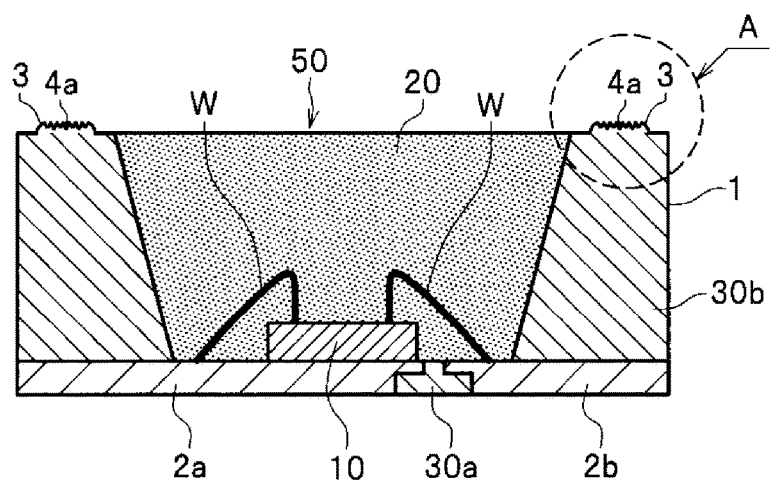
FIG. 3C is a cross section of the light emitting device shown in FIG. 3A taken along X-X.

As shown in FIGS. 3A to 3C, the light emitting device 100A comprises a package 1 having a recess 50, conductive materials 2*a* and 2*b* disposed at the bottom of the package 1 so as to be exposed to the bottom of the recess 50, light emitting element 10 disposed on the conductive material 2*a*, and sealing resin 20 filling the recess 50 package 1. The light emitting device 100A, moreover, has projections 3 on the surrounding surface areas of the recess 50, and rough surface sections 4*a* on the upper surfaces of the projections 3.

In the light emitting device 100A in the second embodiment, the projections 3 have a gently curved shape in cross section prior to forming a rough surface section 4*a* (see FIGS. 3B and 3C). The rough surface section 4*a* is formed on the projection 3.

Figure 4A:
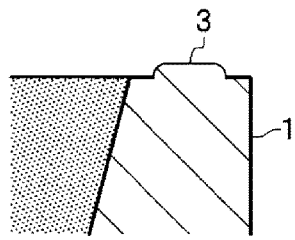
FIG. 4A is a front cross section of a light emitting device in which a package includes a projection without rough surface sections.
Figure 4D:
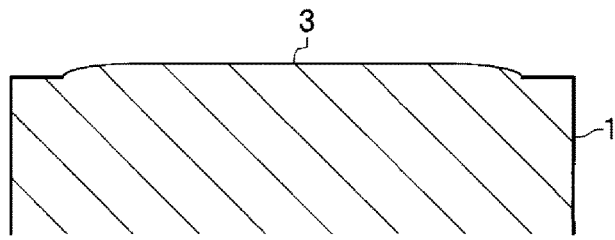
FIG. 4D is a side cross section of the light emitting device shown in FIG. 4A.
Figure 4B:
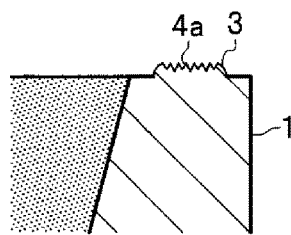
FIG. 4B is a front cross section of a light emitting device in which a package includes a projection with rough surface sections.
Figure 4E:
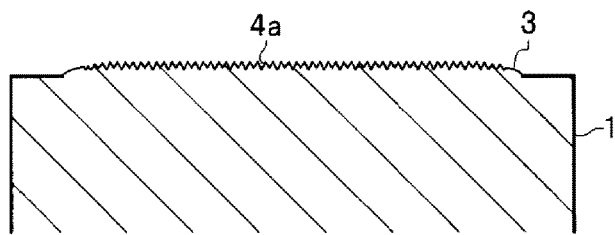
FIG. 4E is a side cross section of the light emitting device shown in FIG. 4B.

Here, as shown in FIGS. 4A to 4F, the shape of the projection 3 of the light emitting device 100A may have a rough surface section 4*a* (see FIGS. 4B and 4E), or not have a rough surface section 4*a* (see FIGS. 4A and 4D). Alternatively, the shape may be such that a rough surface section 4*b* is formed in the region where the projection 3 had been formed by cutting the projection off entirely (see FIGS. 4C and 4F).

The other constituents are the same as those of the first embodiment, the explanations of which will be omitted here.

Method for Manufacturing Light Emitting Devices

Next, a method for manufacturing light emitting devices related to the embodiments will be explained with reference to FIGS. 1 to 7.

In one embodiment, a method for manufacturing the light emitting device 100 (100A) includes a package preparation step, sealing resin forming step, and sealing resin cutting step. Moreover, a die bonding step and a wire bonding step are included after the package preparation step, but before the sealing resin forming step. Furthermore, a singulation step is included after the sealing resin cutting step.

Each step will be explained below. The details of each component of the light emitting device will be suitably omitted, as they are explained in connection with the light emitting device above.

Package Preparation Step

The package preparation step prepares the package 1 having a recess for placing the light emitting element 10.

Here, in the package preparation step, packages 1 may be prepared individually, or in the form of an array 80 which comprises contiguous plural packages 1 as shown in FIG. 1. As shown in FIG. 1, the array 80 is a matrix of prescribed numbers of rows and columns arranged at prescribed intervals.

Here, the package 1 or the array 80 comprises a base material 30*a* and conductive materials 2*a* and 2*b* of the light emitting device 100 (100A), and the side material 30*b* of the light emitting device 100 (100A). In other words, the package preparation step here forms the conductive materials 2*a* and 2*b* at the same time.

Any known method can be used to prepare the package 1 or array 800. For example, the array 80 comprising contiguous plural packages 1 can be prepared as follows:

First, a sheet-shaped lead frame 5 is formed in which one end of the conductive material 2*a* and one end of the conductive material 2*b* are integrally and contiguously formed (see FIG. 5A).

The formation of the conductive materials 2*a* and 2*b* can be accomplished by a known method, and they can be made by using a press or metal sheet etching, for example. They can also be made by plating, vapor deposition, or pasting onto a base material. In cases where they are pasted on a base material, the conductive materials 2*a* and 2*b* can be glued to the base material using a resin adhesive, or the like. The conductive materials 2*a* and 2*b* may be formed by etching the material for the conductive materials 2*a* and 2*b* being formed across the surface of a base material. In this case, a resist can be provided on the conductive materials 2*a* and 2*b*. The resist can be suitably formed by printing.

Subsequently, as shown in FIGS. 5A and 5B, a light reflective epoxy resin package 1 and the recess 50 are formed by transfer molding using the mold 40 and release sheet 60 (see FIGS. 2A to 2C).

More specifically, as shown in FIG. 5A, the sheet-shaped lead frames 5 are first placed on the lower mold 40*b*. Then, the upper mold 40*a* is lowered to eliminate the space S1 between the upper mold 40*a* and the lead frames 5 so they come tightly into contact with one another. Next, the light reflective epoxy resin is injected into the spaces S2 of the upper mold 40*a* and the spaces S3 between lead frames 5. At this time, a release sheet 60 is provided so that the resin injected into the spaces S2 does not come into contact with the upper mold 40*a* by interposing the release sheet 60 between the upper mold 40*a* and resin 6 (see FIG. 5B). By performing a transfer-molding process using the mold 40, an array 80 comprising contiguous plural packages 1, as well as the recesses 50 are formed. In the singulation step discussed later, the array 80 is cut along the broken lines shown in FIGS. 5A and 5B into individual packages 1. At this point, the contiguous region of the conductive materials 2*a* and 2*b* is separated, and the other connected sections of the sheet-shaped lead frames 5 are also separated.

The preparation method of the package 1 or the array 80 is not limited to the method described above. For example, a recess can be formed by gluing the conductive materials 2a and 2b onto a substrate, bonding an upper substrate for forming the side materials to the conductive materials 2a and 2b located on the substrate, and then pressing the upper substrate. The upper substrate and conductive materials 2a and 2b can be bonded by using a bonding material, such as resin, solder paste, or the like, for example.

In the package preparation step here, projections 3 are formed on the surrounding surface areas of the recess 50 of the package 1.

The projections 3 can be formed by a method which utilizes the stretching of an elastic release sheet. More specifically, when transfer-molded while interposing the release sheet 60 between the upper mold 40a and resin 6, as shown in FIG. 5B, the release sheet 60 located on the surrounding surface of the recess 50 (see FIGS. 2A to 2C) stretches, and the release sheet 60 becomes thinner towards the center of the upper surface. Thus, where the release sheet 60 is thinner, the resin 6 becomes thicker. Projections having a prescribed shape are formed on the surrounding surface of the recess 50 in this manner. By adjusting the installation conditions and stretching degree of the release sheet 60, the height, shape, or the like of the projections can be adjusted. This can form the projections 3 in the light emitting device 100 of the first embodiment.

Alternatively, as shown in FIG. 5C, the projections 3 may be formed by using an upper mold 40a which is shaped to give a desired shape of the projections 3. This can form the projections 3 in the light emitting device 100A in the second embodiment. By changing the shape of the upper mold 40a, the projections 3 in the light emitting device 100 of the first embodiment can be made, as well.

Die Bonding Step

The die bonding step mounts the light emitting element 10 on the package (on the conductive material 2a, for example). In the die bonding step, the light emitting element 10 is mounted on the upper surface of the conductive material 2a.

The method for mounting the light emitting element 10 is not particularly limited, and any normally used method will suffice. For example, the light emitting element 10 and the conductive material 2a are bonded by using a solder paste such as AuSn, epoxy resin, or the like.

Wire Bonding Step

The wire bonding step connects the light emitting element 10 with the conductive materials 2a and 2b using wires W. In the wire bonding step, the light emitting element 10 is electrically connected to the conductive materials 2a and 2b by connecting one wire W to the conductive material 2a and the other to the conductive material 2b. The wire bonding method is not particularly limited, and any normally used method will suffice. As a wire W material, gold, silver, copper, platinum, aluminum, an alloy thereof, or the like, can be used.

Sealing Resin Forming Step

Figure 6A:
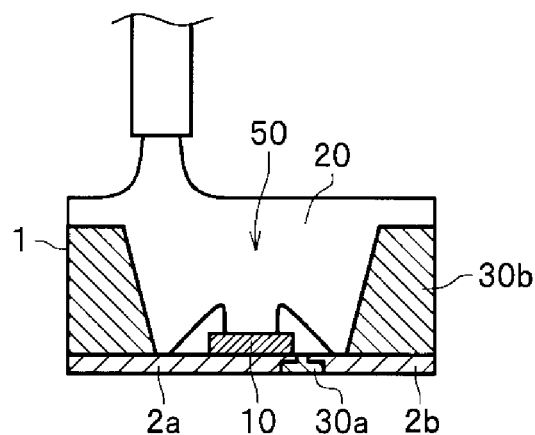
FIG. 6A is a schematic view showing a sealing resin being filled in a recess, during a sealing resin forming step.
Figure 6B:
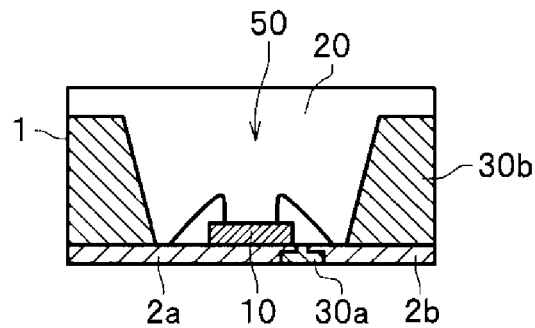
FIG. 6B is a schematic view showing a sealing resin that has been filled in a recess, after the sealing resin forming step of FIG. 6A.

As shown in FIGS. 6A and 6B, the sealing resin forming step fills the recess 50 where the light emitting element 10 is placed with a sealing resin 20, and provides the sealing resin 20 to a level higher than the height of the package 1. First, the recess 50 of the package 1 is filled with the material that forms the sealing resin 20 to cover the light emitting element 10. Here, the material is applied to the entire surface of the package 1 or the array 8 from the efficiency perspective. Thus, the sealing material is also present, in addition to the interior of the recess 50, on the upper surfaces of the side material 30b of the package 1 in a height that is greater than the height of the package 1 in the recess 50. The material is subsequently hardened under heating or light. In this manner, the translucent sealing resin 20 covering the light emitting element 10 is formed.

Sealing Resin Cutting Step

Figure 6C:
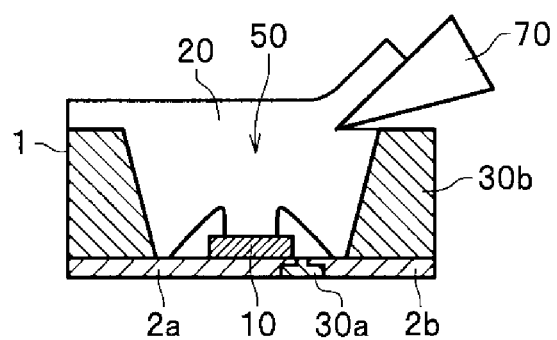
FIG. 6C is a schematic view showing a sealing resin being cut, during a sealing resin cutting step.
Figure 6D:
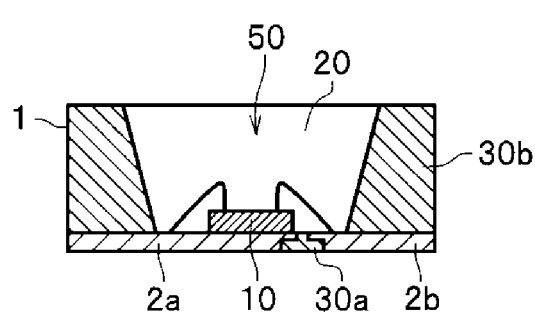
FIG. 6D is a schematic view showing a sealing resin that has been cut, after the sealing resin cutting step of FIG. 6C.

As shown in FIGS. 6C and 6D, the sealing resin cutting step adjusts the sealing resin 20 by cutting the sealing resin 20 to bring the height closer to that of the package 1. In other words, it is a step to remove excess sealing resin 20.

Here, "adjust the sealing resin 20 to bring the height closer to that of the package 1" refers to cutting the sealing resin 20 to reduce, preferably eliminate, the height gap between the upper surfaces of the sealing resin 20 and package 1.

In other words, the height of the upper surface of the sealing resin 20 is made the same as, or slightly higher or lower than, the upper surface of the package 1.

In the sealing resin cutting step, the sealing resin 20 projecting from the upper surface of the package 1 is removed by cutting the sealing resin 20 to make the upper surfaces of the sealing resin 20 and package 1 the same, or substantially the same, height. For the convenience of cutting the sealing resin 20, it is fine if the upper surface of the sealing resin 20 turns out to be slightly higher or lower than the upper surface of the package 1 (for example, the height gap exceeding 0 μm, but about 10 μm at most), but it is preferable to cut the sealing resin 20 so that the heights of the upper surfaces of the sealing resin 20 and package 1 are the same. The cutting method is not particularly limited, and cutting off the excess sealing resin 20 above the upper surface of the package 1 using an edged tool 70, for example, will suffice.

By cutting the sealing resin 20 using an edged tool 70, the rough ridges (burrs) remaining on the surface of the sealing resin 20 can be efficiently removed. This also can ease the strain in the sealing resin 20 caused by residual stress.

Moreover, on the surface of the sealing resin 20, plural grooves of about 1 μm in width and depth are formed so as to extend in the moving direction of the edged tool 70 when cutting the sealing resin 20. Providing grooves in the sealing resin 20 increases the surface area to improve heat dissipation.

In cases where an array 80 is prepared, it is preferable to cut in one pass all sealing resins 20 on the array 80. By cutting in one pass all sealing resins 20 on the array 80 can even more efficiently remove the sealing resins 20 and burrs on the surface of the sealing resins 20.

"Cut in one pass" refers to cutting the sealing resins 20 of plural packages 1 that make up the array 80 by a sequence of actions instead of cutting and adjusting the height of one or a few packages at a time. In other words, this refers to an instance, for example, where all sealing resins 20 on the array 80 are cut without separating the edged tool 70 which began cutting from the sealing resins 20 or array 80 in the middle of the process. However, this does not exclude the instances where the edged tool 70 is incidentally separated from the sealing resins 20 or array 80 as long as they occur in the sequence of actions in the cutting process.

The projections 3 formed on the surrounding surface areas of the recess 50 after the sealing resin cutting process include the three forms described below. Here, the projections 3 in the second embodiment will be explained as representative forms with reference to FIGS. 4A to 4F. FIGS. 4A to 4C correspond to enlarged views of the section indicated by the broken line A in FIG. 3C. FIGS. 4D to 4F correspond to cross sections of the light emitting device shown in FIG. 3A taken along Y-Y, which respectively correspond to FIGS. 4A to 4C.

(1) Embodiment in which Only the Projections are Formed

As shown in FIGS. 4A and 4D, a projection 3 formed on a surrounding surface area of the recess 50 is preserved as is, without being cut during the sealing resin cutting step. In this embodiment, by providing the light emitting device 100A with the projections 3 can prevent the light emitting devices 100A from adhering to one another even without rough surface sections. When cutting, it will suffice if the edged tool 70 is adapted so as not to cut the projections 3 when it reaches the locations by suitably adjusting the angle and pressure of the edged tool 70.

(2) Embodiment in which Rough Surface Sections are Formed on the Projections

As shown in FIGS. 4B and 4E, a rough surface section 4a is formed on the projection 3 by cutting one section of the projection 3 formed on the surrounding surface area of the recess 50 in the sealing resin cutting step.

Here, one section of projection 3 refers to a prescribed region of the upper section of the projection 3, and the region can be defined, for example, as ½ to ⅔ from the upper surface of the projection 3 in terms of the height of the projection 3 before cutting. Even in cases of the first embodiment, the region can be ½ to ⅔ from the upper surface of the projection 3 in terms of the height at each location of the slope of the projection 3 (the height of the projection 3 extends upwardly and perpendicularly from the bottom of the projection 3). The thickness and width of the region, however, are not particularly defined, the cut region of the projection 3 may be of any degree to the extent that the rough surface section 4a can be formed on the upper surface of the projection 3.

Next, the method for forming the rough surface section on the upper surface of the projection will be explained with reference to FIGS. 7A to 7D.

Figure 7A:
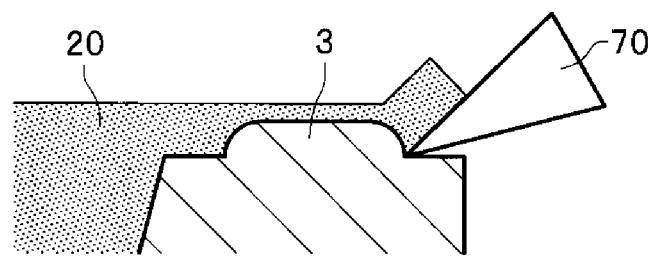
FIG. 7A is a schematic view showing a sealing resin being cut up to a location of a projection, during a step of forming a rough surface section on the projection.
Figure 7B:
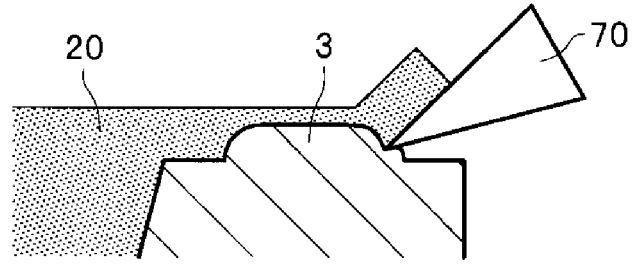
FIG. 7B is a schematic view showing a location of an edged tool on an upper surface of the projection, during the step of forming a rough surface section on the projection.
Figure 7C:
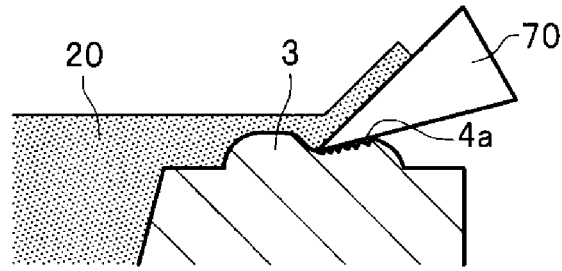
FIG. 7C is a schematic view showing a location of an edged tool after cutting a portion of the projection to form the rough surface section.
Figure 7D:
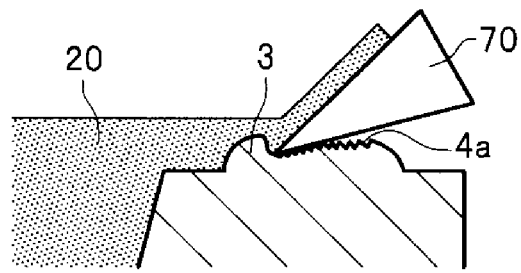
FIG. 7D is a schematic view showing a location of an edged tool after cutting an additional portion of the projection to form the rough surface section.

As shown in FIG. 7A, the sealing resin 20 on the surrounding surface of the recess 50 of the package is first cut up to the location of the projection 3 using an edged tool 70. Next, as shown in FIG. 7B, the angle and pressure of the edged tool 70 is changed so as not to cut the root of the projection 3, and to adjust the edged tool 70 to be positioned on the upper surface of the projection 3. Then, as shown in FIGS. 7C and 7D, the edged tool 70 is moved towards the recess 50 of the package 1 while cutting a section of the projection 3 by adjusting the angle and pressure of the edged tool 70. At this point, since the projection 3 is elastic, the section of the projection 3 is cut while it slightly caves in. After cutting the section of the projection 3, the angle and pressure of the edged tool 70 is changed again to cut the sealing resin 20 on the surrounding surface of the recess 50 of the package 1, and then cut the sealing resin 20 on the upper surfaces of the recess 50. One section of the projection 3 located on the opposite side of the surrounding surface of the recess 50 is also cut in the same manner.

The cutting amount of the projection 3 and the surface characteristics of the rough surface section 4a (surface roughness Ra, for example) are controlled by suitably adjusting the cutting speed, and the pressure and angle of the edged tool, or the like, when cutting one section of the projection 3.

Although it would depend on the conditions, using a hard and brittle material, such as an epoxy resin, for example, for the package 1 makes the cutting of one section of the projection 3 easier.

For the projections 3 of the light emitting device 100 in the first embodiment, the method for forming the rough surface section 4a is basically the same as that described earlier. In cases of the first embodiment, cutting one section of projection 3 along the slope of the projection 3 while cutting the sealing resin 20 on the surrounding surface of the recess 50 of the package 1 will suffice.

(3) Embodiment in which only Rough Surface Sections are Formed

As shown in FIGS. 4C and 4F, a rough surface section 4b is formed in the region where the projection 3 had been formed by cutting entirely the projection 3 formed on the surrounding surface area of the recess 50 in the sealing resin cutting step. In other words, the projection 3 is cut off and the rough surface section 4b is formed in the region where the projection 3 used to be formed.

In this form, the entire projection 3 is removed by cutting the root thereof by changing the angle and pressure of the edged tool 70 so as not to leave the projection 3 behind. This forms the rough surface section 4b on the surrounding surface area of the recess 50 in the region where the projection 3 used to be formed.

Here, the rough surface section 4b formed in the region where the projection 3 used to be formed is the rough surface region on the surrounding surface area of the recess 50 having a prescribed surface characteristics (surface roughness Ra, for example) created by cutting off the entire projection 3 while cutting the sealing resin 20.

The surface characteristics (surface roughness Ra, for example) of the rough surface section 4b is controlled by suitably adjusting the cutting speed, and the pressure and angle of the edged tool 70, or the like, when cutting the projection 3.

In this embodiment, even when the projections 3 are entirely removed, the light emitting device 100A has the rough surface sections 4b in the regions where the projections 3 used to exist prior to cutting. Thus, adhesion of light emitting devices can be prevented.

Singulation Step

The singulation step singulates the packages 1 after cutting the sealing resins 20 in cases where an array 80 comprising contiguous plural packages 1 is prepared in the package preparation step.

Singulation of the array 80 can be performed by any known method, such as dicing to cut the array 80 along the dividing lines, scribing to split the array 80, or the like.

Singulation of the array 80 produces plural light emitting devices 100 (100A).

The embodiments have been explained above, but the invention is not limited to the embodiments discussed above, and modifications can be made without deviating from the purport of the invention.

In other words, the modes of the methods for manufacturing light emitting devices and the light emitting devices disclosed above exemplify the methods for manufacturing light emitting devices and the light emitting devices that embody the technical ideas of the invention, and the invention is not limited to the above disclosed methods and forms. Moreover, the components, materials, or the like shown in the scope of the patent claims are not limited to those described in the embodiments. It is not intended to limit the scope of the invention by the sizes, materials, and relative arrangements of the constituent elements disclosed in the embodiments unless otherwise specifically noted, and they are merely exemplary explanations.

For example, a metal material for increasing the light reflection efficiency at the conductive materials 2a and 2b may be provided on the surfaces of the conductive materials 2a and 2b. There is no particular limitation for the metal material, and for example, silver alone, or silver alloys with copper, gold, a metal having a high reflection coefficient, such as rhodium, or the like, as well as a multilayer film, or the like, of these silver and alloys can be used. Preferably, gold alone is used, which is superior in terms of thermal conductivity, etc. Moreover, as for the film thickness of the metal material, it is preferably a metallic foil of about 0.005 to 20 µm, and in cases where a multilayer film is used, it is preferable to set the total thickness of the layer to fall within this range. As for the method for forming the metal material, plating, sputtering, vapor deposition, or the like can be employed.

In cases where a metal material is provided on the surfaces of the conductive materials 2a and 2b, a metal material forming step is performed in the above described method for manufacturing light emitting devices during or after the package preparation step, but before the die bonding step.

As a method for providing a metal material, plating, sputtering, vapor deposition, thin film bonding, or the like can be employed. When plating, either electroplating or electroless plating may be used. For example, the simplest way is to employ electroplating after electrically connecting the applicable regions on the surface of the conductive materials 2a and 2b. When employing sputtering or vapor deposition, the metal material can be provided only on the conductive materials 2a and 2b by photolithography. Alternatively, the conductive materials 2a and 2b and metal material may be patterned into a prescribed shape after providing the metal material on the unpatterned conductive materials 2a and 2b.

In addition, in the embodiments described above, the light emitting element is a face-up (FU) element, but it may alternatively be a face-down element.

In cases where a face-down element is used, the light emitting device 100 (100A) may be equipped with an underfill (not shown) between the bottom face of the package 1 (i.e., the bottom surface of recess 50) and the light emitting element 10. Providing an underfill can improve the optical characteristics, such as light extraction efficiency, and increase the heat dissipation of the light emitting device 100 (100A), as well as easing the thermal expansion and mechanical stress between the light emitting element 10 and the package 1. This can therefore increase the reliability of the light emitting device 100 (100A). Examples of underfill materials include thermosetting resins, such as a silicone resin, epoxy resin, or the like.

Moreover, a protective element such as a Zener diode or the like may be provided. Furthermore, the embodiments described above employed a configuration with one light emitting element 10, but two or more light emitting elements may be provided. In cases where two or more light emitting elements are mounted in a light emitting device, the light emitting elements may have different emission wavelengths. For example, three light emitting elements emitting three primary colors of R, G, and B may be mounted.

In the method for manufacturing light emitting devices, a step other than the steps described above may be included between the aforementioned steps, or before or after any of the steps. For example, steps such as a package cleaning step for cleaning the package 1, an unnecessary substance removal step for removing unnecessary substances, such as dust or the like, a mounting position adjusting step for adjusting the mounting position of the light emitting element 10, or the like, may be included.

What is claimed is:
1. A light emitting device, comprising:
a light emitting element,
a package having a recess in which the light emitting element is located, and
a sealing resin filling the recess,
wherein the package includes a projection extending from an upper surface of the package, the projection at least partially surrounding the recess,
wherein a roughened surface section is formed on an upper surface of the projection,
wherein the upper surface of the projection on which the roughened surface section is formed is inclined in a direction away from the light emitting element, and
wherein the upper surface of the projection has an inner edge and an outer edge, and the roughened surface section on the upper surface of the projection extends from the inner edge to the outer edge.
2. The light emitting device according to claim 1, wherein an upper surface of the sealing resin is at a height that is substantially the same as a height of the upper surface of the package.
3. The light emitting device according to claim 1, wherein a width of the package is less than a length of the package, and the projection is formed in a width direction of the package.
4. The light emitting device according to claim 1, wherein a height of the projection is 3 to 7µm.
5. The light emitting device according to claim 1, wherein the package is made of an epoxy resin.
6. The light emitting device according to claim 1, wherein the sealing resin is made of a silicone resin.
7. The light emitting device according to claim 1, wherein the upper surface of the projection on which the roughened surface section is formed is a convex surface.
8. A light emitting device, comprising:
a light emitting element,
a package having a recess in which the light emitting element is located, and
a sealing resin filling the recess,
wherein the package includes a projection extending from an upper surface of the package, the projection at least partially surrounding the recess,
wherein a roughened surface section is formed on an upper surface of the projection,
wherein the upper surface of the projection on which the roughened surface section is formed is inclined in a direction away from the light emitting element,
wherein, in a top view the light emitting device, the upper surface of the package has a first outer edge and a second outer edge in a width direction, and a third outer edge and a fourth outer edge in a length direction,
wherein the recess has an opening at the upper surface of the package,
wherein the opening is defined by a first edge and a second edge in a width direction, and a third edge and a fourth edge in a length direction, and
wherein the upper surface of the package includes:
a first non-roughened surface section that extends between the third edge of the opening and the third edge of the package, and
a second non-roughened surface section that extends between the fourth edge of the opening and the fourth edge of the package.
9. The light emitting device according to claim 8, wherein the projection includes a first lateral surface and a second lateral surface, each extending from the upper surface of the package to the upper surface of the projection.
10. The light emitting device according to claim 9, wherein:

the first non-roughened surface section further extends between the first lateral surface of the projection and the third edge of the package, and the second non-roughened surface section further extends between the second lateral surface of the projection and the fourth edge of the package.

11. The light emitting device according to claim 10, wherein:
the third edge of the opening is aligned with the first lateral surface of the projection, and
the fourth edge of the opening is aligned with the second lateral surface of the projection.

12. The light emitting device according to claim 8, wherein:
the projection is a first projection,
the roughened surface section is a first roughened surface section,
the package further includes a second projection,
a second roughened surface section is formed on an upper surface of the second projection,
the upper surface of the second projection on which the second roughened surface section is formed is inclined in a direction away from the light emitting element.

13. The light emitting device according to claim 12, wherein the second projection includes a first lateral surface and a second lateral surface, each extending from the upper surface of the package to the upper surface of the second projection.

14. The light emitting device according to claim 13, wherein:
the first non-roughened surface section further extends between the first lateral surface of the second projection and the third edge of the package, and
the second non-roughened surface section further extends between the second lateral surface of the second projection and the fourth edge of the package.

15. The light emitting device according to claim 14, wherein:
the third edge of the opening is aligned with the first lateral surface of the second projection, and
the fourth edge of the opening is aligned with the second lateral surface of the second projection.

16. The light emitting device according to claim 8, wherein the upper surface of the projection on which the roughened surface section is formed is a convex surface.

17. The light emitting device according to claim 9, wherein the upper surface of the projection on which the roughened surface section is formed is a convex surface.

18. The light emitting device according to claim 10, wherein the upper surface of the projection on which the roughened surface section is formed is a convex surface.

19. The light emitting device according to claim 11, wherein the upper surface of the projection on which the roughened surface section is formed is a convex surface.

* * * * *